United States Patent [19]
Collier

[11] Patent Number: 4,874,127
[45] Date of Patent: Oct. 17, 1989

[54] CLIMATE CONTROL APPARATUS

[76] Inventor: William R. Collier, 1 S. 141 Spring Rd., Oakbrook Terrace, Ill. 60181

[21] Appl. No.: 119,805

[22] Filed: Nov. 12, 1987

[51] Int. Cl.$^4$ .............................................. F24F 13/10
[52] U.S. Cl. ..................................... 236/49.5; 98/316; 98/40.19; 165/22; 165/50
[58] Field of Search ............... 236/49 D, 49 R; 98/31, 98/31.6, 40.01, 40.19; 237/46; 165/50, 53, 55, 22

[56] References Cited

U.S. PATENT DOCUMENTS

| | | | |
|---|---|---|---|
| 3,366,364 | 1/1968 | Curran | 98/31 X |
| 3,516,347 | 6/1970 | May | 98/31 |
| 4,135,440 | 1/1979 | Schmidt et al. | 98/31 |
| 4,425,839 | 1/1984 | Stull | 98/40.01 |
| 4,531,454 | 7/1985 | Spoormaker | 98/31.6 |
| 4,646,966 | 3/1987 | Nussbaum | 98/31 X |

Primary Examiner—William E. Tapolcai
Attorney, Agent, or Firm—Lockwood, Alex, FitzGibbon & Cummings

[57] ABSTRACT

A multi-level access flooring system having a work area floor and at least one intermediate floor, defining at least one isolated wireway between the intermediate floor and the work area floor, and at least one relatively unobstructed plenum, between the intermediate floor and the building floor, together with at least one HVAC inlet to such plenum and a plurality of individual outlets, with each outlet having its own flow control damper, together with a suitable control system for positioning the individual dampers and regulating the heating/cooling load of the HVAC unit to achieve localized as well as generalized control of climate within a building room.

5 Claims, 3 Drawing Sheets

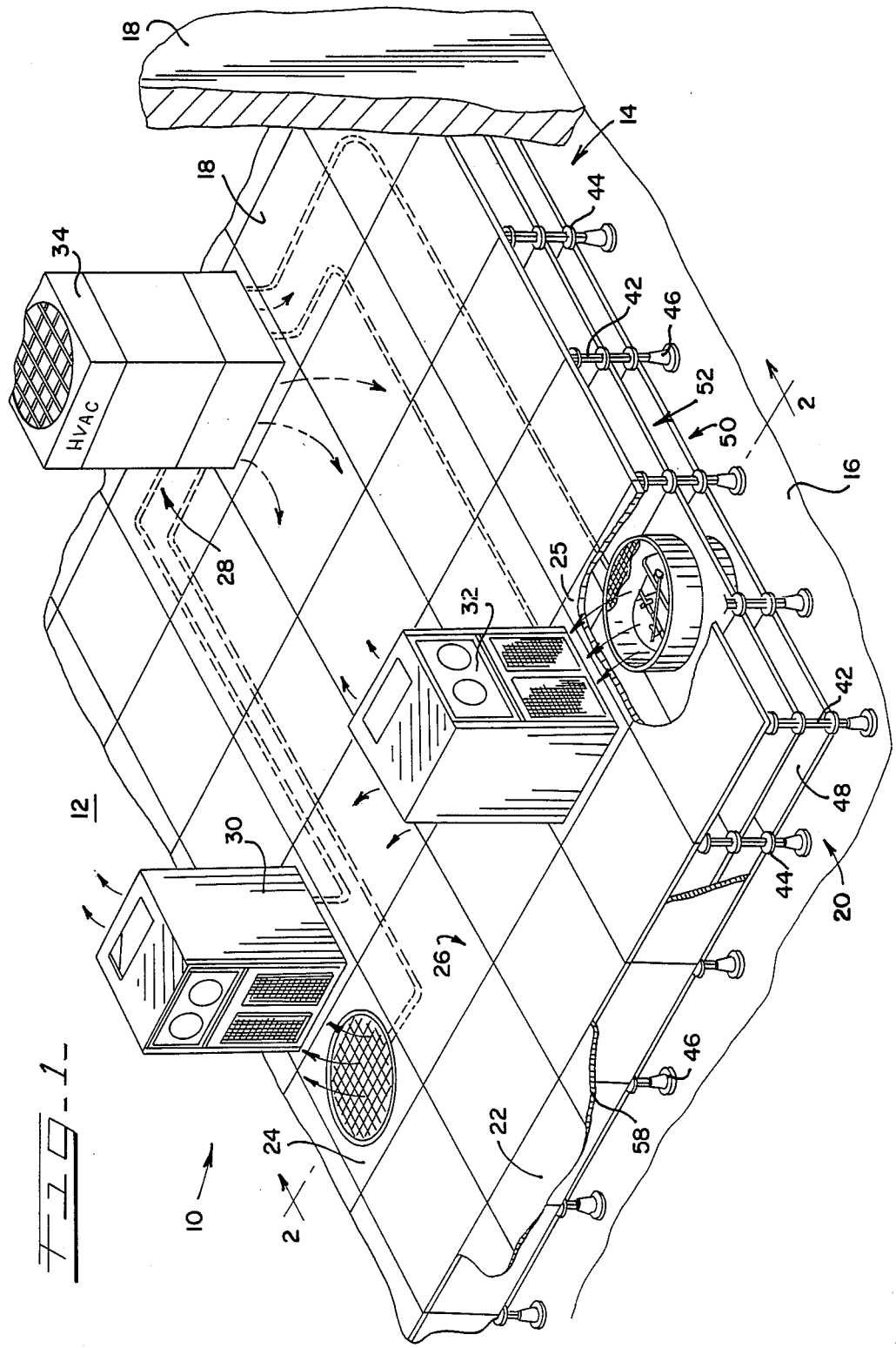

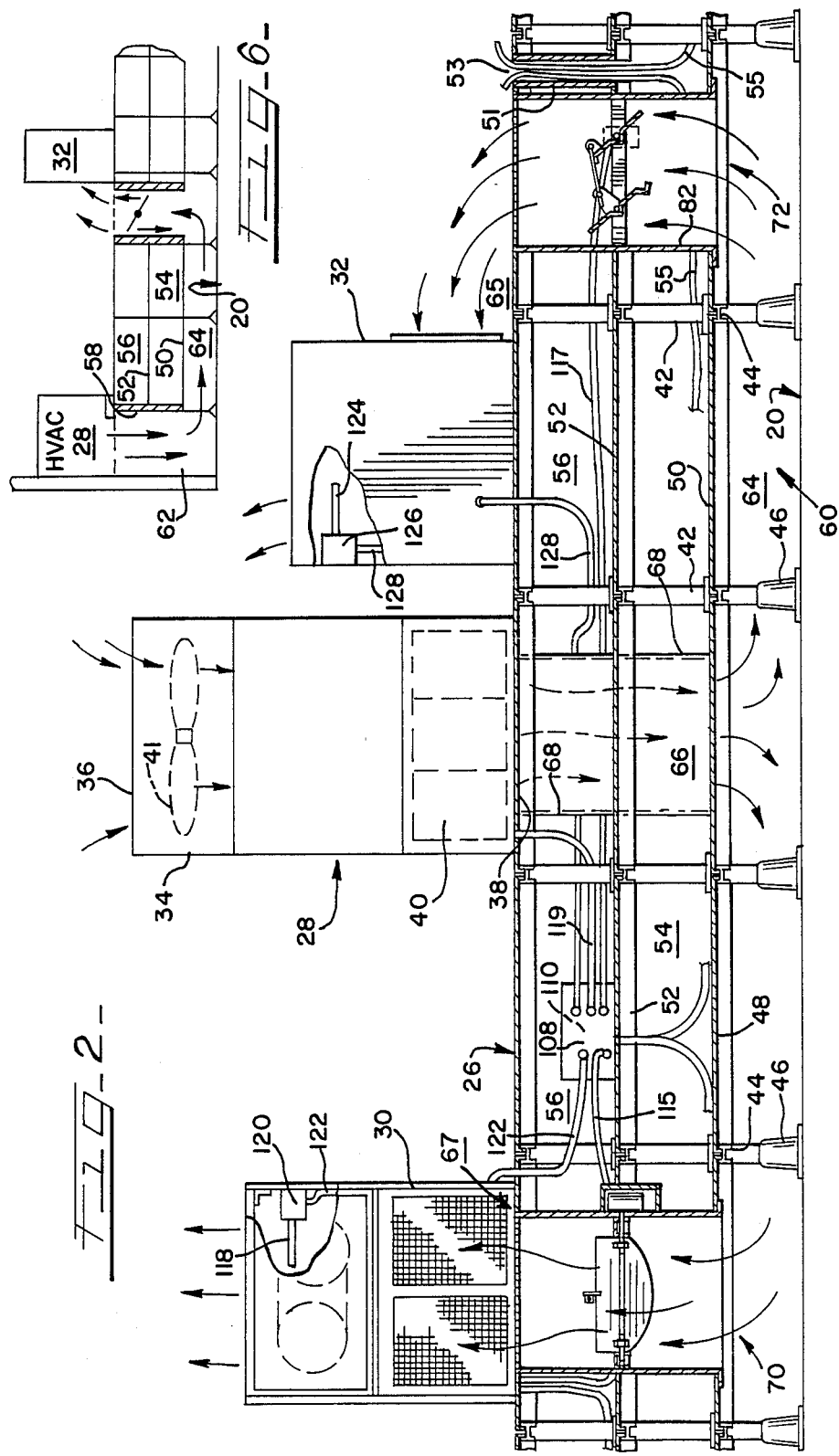

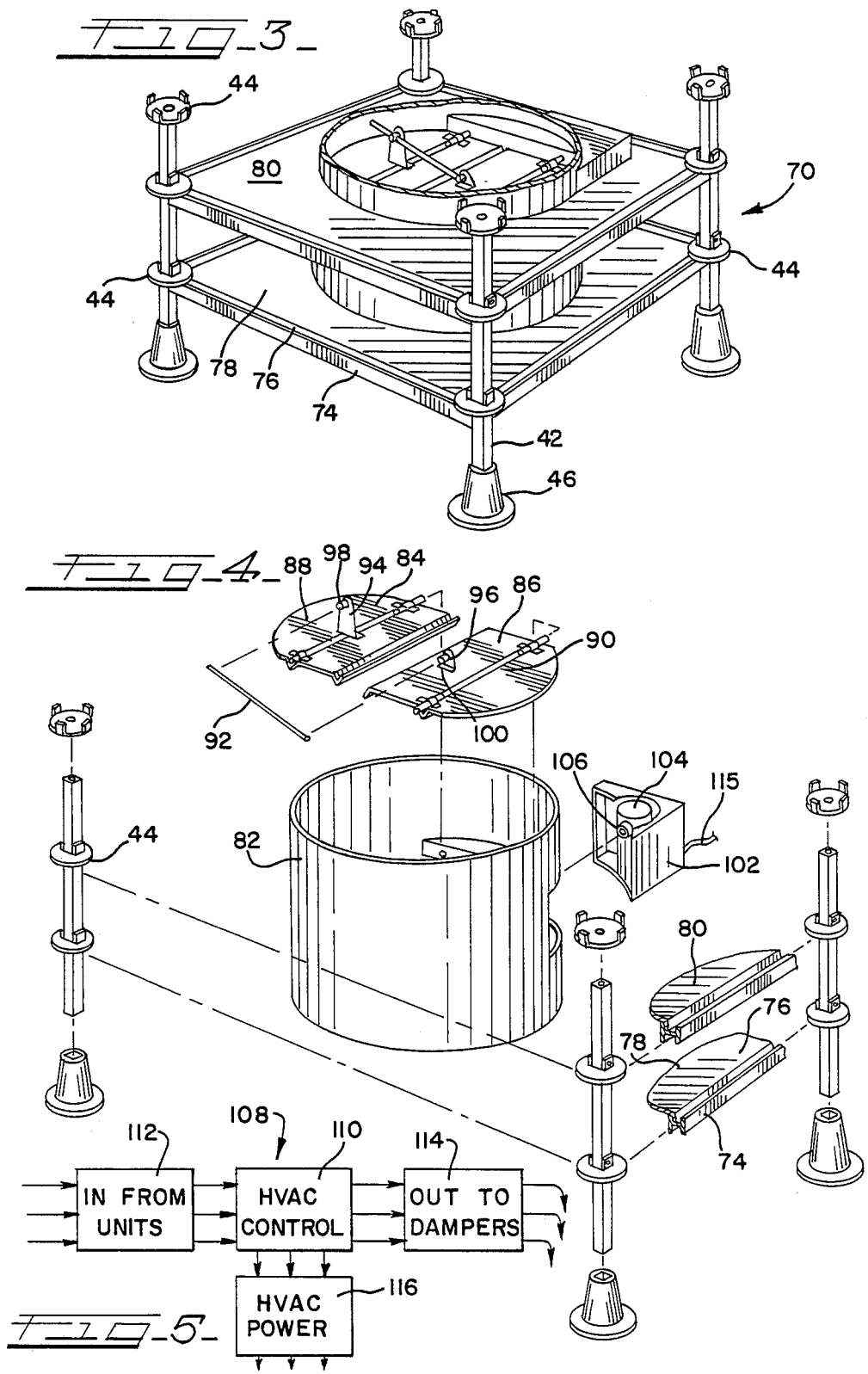

CLIMATE CONTROL APPARATUS

The present invention relates generally to climate control apparatus, and more particularly, to a climate control apparatus for use with, or forming a part of, a so-called raised access flooring system.

It is well known today that there is a large demand for so-called raised access floor installations. These installations are primarily made in so-called computer rooms, but are also in use in certain hospital applications, "clean" industrial rooms, or elsewhere wherein careful climate control is needed for the operation of sensitive machines, and/or equipment, for special care of personnel, or for other suitable purposes.

Until the last few years, the primary form of raised access flooring in use was a single tier floor arrangement which consisted simply of a series of horizontally extending floor panels arranged to form a work area floor and spaced above a building floor by means of a grid of pedestals, stringers and the like. The panels forming the working area floor in an arrangement of this sort are readily removable so that access may be had to the so-called mechanical space between the work area floor and the building floor. This space customarily includes individual HVAC ducts, wiring, plumbing, etc. The term "raised access floor" has become the generic term for this type of arrangement.

Recently, an important innovation was made in raised access flooring. This improvement is described and claimed in the Collier U.S. Pat. No. 4,630,417, issued Dec. 23, 1986. As described in the Collier patent, instead of using a single tier raised access floor wherein there is a single mechanical space, there is provided a multi-level access floor, ordinarily comprising two or three levels. With this arrangement, in contrast to the single tier raised access floor, a level may be dedicated exclusively to one type of function, such as for heating, ventilating and air conditioning ("HVAC"), high voltage conductors, low voltage conductors, etc.

Using this system, installation, maintenance and rerouting of electrical cables is greatly simplified, and it is also possible to provide a greatly improved air circulation plenum. In this system, the wiring for the computers and related equipment is disposed in one or two cavities or wireways which themselves isolated mechanically from each other and from the HVAC plenum. As pointed out, these wireway cavitities are normally dedicated respectively to high and low voltage wiring, respectively. The wireway cavities are substantially continuous out to the periphery of the room in question, but here and there "chimneys" extend through these wireways to permit the passage of HVAC air from the main plenum space at the lowermost level of the multi-level floor through the one or more wireways and to an area at and above the work area floor.

The air plenum thus consists of a generally, uninterrupted air space lying beneath the lowermost of the one or more floors which are disposed intermediate the work area floor and the building floor. Customarily, HVAC air is introduced into this plenum from above or from the side, either through a vertically extending duct or "chimney", from around the periphery of the room, or a combination of both. In any case, the air flow then takes place generally horizontally beneath the lowermost intermediate floor just described, and thence vertically through the wireways for discharge through grills or apertured panels into the work room. From here, the air is drawn into the inlets of one or more of the HVAC units and recirculated through the plenum, back to the room and so on.

According to the present invention, advantage is taken of the use of the recently developed multi-level raised access floor concept to provide a substantially uninterrupted plenum space between the building floor and an intermediate floor in the multi-level floor system for flow of air. The availability of this common plenum with excellent air flow capabilities in respect to the volume and uniformity of air velocity are taken advantage of by placing individual dampers in each of the plenum outlets, which are preferably in the form of vertical stack units.

Further in accordance with the invention, a series of controls is provided so that a correct amount and balance of conditioned air is provided to insure proper cooling without wasted effort on the part of the machines and equipment in place on the raised access floor, and without waste of HVAC energy.

For example, each of the computers or other pieces of equipment has its own air circulation system, including inlet and outlet passages. A temperature sensing unit is placed against the outlet air stream of each such computer. A damper is placed in each vertical plenum outlet passage to control air flow therethrough, and an association is made between the outlet air temperature detector and the individual adjacent damper by the control system. The control system further interfaces with the various elements of the HVAC unit, which is more remote from the damper controlled outlets. Typically, the temperature drop over the evaporator coils, the fan speed, and the decision as to whether the HVAC unit is in operation at all are decisions which may be controlled. Any number of HVAC units and damlpers may be connected by suitable networks.

In use, the conditioned air temperature requirements for each computer or the like are sensed within the computer or like unit itself. These sensors then, in relation to given set points, determine whether a reduced or increased air supply is called for to meet the needs of the equipment. This information is then fed in a conventional manner to the HVAC unit where and to the individual dampers, whereby the atmosphere in the room as a whole may be controlled by appropriate variation of the workload of the HVAC unit, and whereby the air flow in the vicinity of each individual computer or the like is controlled by its associated damper.

Because the prior art has failed to provide such a system, particularly with a multi-raised access floor system having an unobstructed HVAC plenum, it is an object of the present invention to provide an improved climate control apparatus for a computer room or the like.

Another object of the invention is to provide a computer room or the like having a control system adapted to regulate air flow individually among the individual pieces of equipment disposed in the room, and to have all such controls used in association with an uninterrupted plenum space forming a part of, or disposed beneath a multi-level raised access flooring system.

A further object of the invention is to provide a method of controlling climate conditions within a computer room or the like, which method includes providing a multi-level access floor assembly providing a substantially uninterrupted horizontal plenum with at least one inlet and plural controllable air outlets, and providing suitable detectors and air flow controls to effect both generalized and localized control of cooling on an energy-efficient basis.

The invention is carried into practice by providing a multi-level access flooring system having a work area floor and at least one intermediate floor, defining at least one isolated wireway between the intermediate floor and the work area floor, and at least one relatively unobstructed plenum, between the intermediate floor and the building floor, together with at least one HVAC inlet to such plenum and a plurality of individual outlets, with each outlet having its own flow control damper, together with a suitable control system for positioning the individual dampers and regulating the heating/cooling load of the HVAC unit to achieve localized as well as generalized control of climate within a building room.

The invention is also carried into practice by the method of regulating air flow and temperature control as aforesaid.

The exact manner in which the foregoing and other objects and advantages of the invention are achieved in practice will become more clearly apparent when reference is made to the following detailed description of the preferred embodiments of the invention set forth in detail and shown in the accompanying drawings, wherein like reference numbers indicate corresponding parts throughout.

BRIEF DESCRIPTION OF THE DRAWINGS

FIG. 1 is a perspective view of the climate control system of the invention, showing an HVAC supply unit, two computers, a multi-level access floor supporting these units and a pair of plenum outlets each individually controlled by dampers;

FIG. 2 is a vertical sectional view, with portions broken away and partly diagrammatic in character, showing the construction and arrangement of the wireways and plenum spaces in the climate control system;

FIG. 3 is a perspective view of a form of motor-driven control damper preferred for use with the invention;

FIG. 4 is an exploded perspective view of certain elements of the damper apparatus of FIG. 3;

FIG. 5 is a simplified schematic view of a control system made according to the invention; and FIG. 6 is a diagrammatic view of a plenum inlet and outlet arrangement used with the invention.

DESCRIPTION OF THE PREFERRED EMBODIMENTS OF THE INVENTION

While the present invention may be carried into practice in a variety of ways, and used in many different applications, reference will be made to an illustrative form of apparatus wherein the HVAC unit is positioned atop a multi-level raised access floor and to furnish air to a substantially uninterrupted plenum, from which plural plenum outlets extend back into the room interior in the area above the working area floor and adjacent computers or like apparatus.

A control system operates dampers adapted to regulate the flow of the air from the plenum space to the room interior or an individual basis, and the controls further regulate the output of the HVAC or climate control unit, both as to volume and temperature. Both peripheral and direct duct type inlets to the HVAC plenum are described.

Referring now to the drawings in greater detail, FIGS. 1 and 2 show a climate control system generally designated 10 and adapted to control the temperature or other conditions of climate within the interior 12 of a computer room generally designated 14. This room 14 is defined in part by a building floor 16, and one or more vertically extending sidewalls 18 (only two shown in FIG. 1). According to the invention, a raised access floor assembly generally designated 20 is provided and this assembly 20 is shown to include a plurality of imperforate panels 22 arranged in a horizontal array and, as illustrated, to further include first and second apertured panels 24, 25. When all the panels 22, 24, 25 are considered together, they define a work area floor generally designated 26. This is a floor on which workers move in performing their task, and this floor 26 also serves to support the equipment normally used in such room, including an HVAC supply unit generally designated 28 and a plurality of computers, 30, 32. The expression "computer" as used herein is not be taken in the limiting or definitive sense, but only as an illustration that such equipment is suitable for use with the invention. What is described as the computer will also be understood to include, in the alternative, computer peripheral equipment of any kind, including, but not limited to, tape drives, printers, power supplys or the like, as well as other equipment of any kind which requires or uses an air circulation cooling system.

As shown, the HVAC supply unit 28 may typically include a fan housing portion 34 and a grille 36 for receiving inlet air. Referring to FIG. 2, an HVAC discharge outlet 38 is shown as lying beneath evaporator coils 40 forming a part of the unit, and a fan element 41 is schematically shown at the top of the cabinet in which the HVAC unit 28 is disposed.

Referring now to the multi-level access floor assembly 20, this unit is also shown to include, from the structural standpoint, a plurality of support columns each designated 42, a plurality of brackets 44, and a plurality of pedestals 46 arranged in a grid so as to support a plurality of flooring panels 48 which respectively define first and second intermediate floors generally designated 50, 52. In this connection, reference is made to the Collier U.S. Pat. No. 4,630,417, which shows a multi-level raised access floor which is the same as or similar to that which may be used with the present invention.

The intermediate floors just discussed, in combination with the work area floor 26, serves to define a high voltage wireway 54, lying between the first or lower and the second or higher intermediate floors 50, 52, and a low voltage wireway or cavity 56 is defined between the second or upper intermediate floor 52 and work area floor 26.

FIGS. 1 and 6 illustrate schematically that the ends of the individual wireways 54, 56 are closed off in a suitable manner, whether by vertically extending panels 58, or by the inner surfaces of the building walls 18. In any case, the end portions of the wireways 54, 56 are completely closed off. In this connection, it will be understood that, because a principal code requirement of raised multi-level access floors of this type is that each wireway be mechanically separated or isolated from the other wireway, and that both wireways be separated from the HVAC plenum, it is necessary to insure that this be carried out in some suitable manner.

FIG. 2 shows that the wireways themselves, insofar as is practicable, are open within the periphery of the entire structure, as is now known in the industry, but are not open as to one another or to the HVAC plenum. Where wires from the high voltage cavity are required to pass through the low voltage cavity or the HVAC plenum, mechanical isolation is provided, as by providing a wireway "chimney"; for example, this is shown as an enlarged conduit 51 having an outlet 53 in the floor 26 The cable 55 carrying high voltage thus pass through but are mechanically isolated from the low voltage plenum 56. Any other means of mechanical isolation may be used.

FIG. 2 also shows that an NVAC plenum generally designated 60 is defined in the space between the first intermediate floor 50 and the building floor 16. This space may include a peripheral plenum section 62 (FIG. 6) in addition to the main plenum space 64 lying between the building floors 20. In this connection, the principal plenum space is one which is substantially unobstructed by the passage of ducts, large assemblages of wire and the like, but it is understood that this area may include necessary portions of the support columns, the pedestals, etc. illustrated in FIGS. 1 and 2.

According to the invention, there is also provided at least one plenum inlet 66. This may be in the form of a passage or "chimney" defined by vertical wall panels 68, or it may consist entirely or partially of a peripheral plenum space 62. A plurality of outlet stack assemblies generally designated 70, 72 also are provided, and these extend between the main plenum space 64 and the areas 65, 67 in the work area floor just adjacent the outlets and the computers or the like 30, 32 whose temperature is to be controlled.

These stacks are preferably, but not necessarily, of modular construction and are arranged as shown in FIGS. 3 and 4. Here, each unit 70, 72 is shown to include a plurality of columns 44, pedestals 46, and stringers 74 arranged therebetween to receive and position the outer margins 76 of the various stack assembly floor panels 78, 80 forming, respectively, portions of the first and second intermediate floors 50 and 52.

A typical stack assembly 70 includes a generally cylindrical tube section 82 forming a passage or "chimney", a pair of dampers, 84, 86 each mounted for pivotal movement about the axis of rods respectively designated 88, 90. The damper elements 84, 86 are connected for substantially simultaneous movement by a link 92 extending betwen a pair of offset brackets 94, 96 which in turn receive pivotable, apertured, link receiving eye units 98, 100.

As is shown in FIGS. 3 and 4, a motor housing 102 is provided for positioning a reversible, geared electric motor 104 having a drive shaft 106 which is operatively connected to the pivotally mounted rod 90 on one of the dampers. In use, one damper unit is a primary or drive damper unit and the other is a slave or drive unit, as is apparent from the dawings, and as is known to those skilled in the art.

Referring now to FIG. 5, there is shown schematically a control circuit box generally designated 108 and shown to include a central processor unit 110, which serves as the HVAC control. As shown, signals are generated at the computers 30, 32 which are indicative of the temperature detected at a terminal 112. These signals are then processed and fed to an outlet terminal 114 for the damper control units. The central processor 110 is also operatively connected to a terminal 116, from which control signals in appropriate form are sent to the HVAC supply unit 28.

Referring again to elements of the control system, the computer 30 is shown in the broken-away portion of FIG. 2 to include an on-board control unit which includes a temperature probe 118 extending from a transducer 120, from which a control line 122 in turn extends to the signal processing unit. Likewise, the computer 32 includes its own temperature probe 124, transducer 126 and a control line 128 extending therefrom.

Referring now to the operation of the climate control apparatus 10, it will be assumed that an HVAC unit 28 is provided which is operation and has its evaporator coils energized so as to produce a cooling effect on air passing therethrough; it is further assumed that these coils may bear an increased cooling load if indicated by an appropriate control.

It is further assumed that a variable speed fan is provided and that fresh air is passing, as indicated in FIG. 2, through the coil 36 in the fan housing 34 of the HVAC unit 28, and that this conditioned air is passing through the plenum inlet 66 for the main plenum space 64.

It will be further assumed that the two computer 30, 32 or like pieces of equipment are operating and that air is circulating from the HVAC unit through the plenum space 64 and through both of the outlet stack assemblies 70, 72. It will be still further assumed that the movable dampers 84, 86 in each of the stack assemblies are positioned so as to permit a given air flow at the pressure being developed in the plenum 64, and that the computer unit 30 is being subjected to an increasing load. The outlet temperature of the air passing through the computer 30 is detected by the temperature probe 118. When this temperature rise is detected and transduced at 120, it creates a signal which is passed through line 122 to the central processor 110 where it is detected as being in excess of a predetermined set point appropriate for the computer 30. This calls for additional cooling in the vicinity of the computer 30.

However, since a common plenum space is provided, this may be easily accomplished, assuming the use of suitable controls. In this connection, such controls are known to those skilled in the art and are commercially available.

An important feature of the present invention is the use of a multi-level raised access floor which is effectively able to provide the unobstructed plenum space 64. This unobstructed space is important because control of air flow may be achieved in such construction.

Accordingly, the central processor 110 located in the control circuit box 108, having received such signal through line 122, moves to provide additional cooling air in the vicinity of the computer 30 by sending a signal through line 115 to the motor 104. The signal is of a polarity suitable to operate the motor drive so as to open the dampers 84, 86. This permits additional cooling air to flow from the plenum space 64 into the area of the working floor immediately adjacent the computer 30. This condition will prevail until the temperature at the outlet of the comptuer 32, as detected by the probe 118 falls below the set point. According to a typical computer program, the damper will be opened a predetermined amount and a certain amount of time will be permitted to elapse awaiting the time at which the set point of the control for the computer 30 is reached.

The same situation may apply to computer 32 which, for the present, will also be assumed to be calling for additional cooling. Counterpart signals are thus generated in the probe 124 transduced by the unit 126 and a signal is sent through the line 128 to the control 110 in the box 108. This will, in turn, cause a signal to be sent through line 117 to the motor for driving the dampers in the stack assembly 72.

Under the hypothetical case assumed, this manipulation for the dampers should also decrease the temperature of the unit 32 to a suitable level within an acceptable time. If this does not occur, the microprocessor in the control 110 will then send a suitable signal through the line 119 to the HVAC unit 28. The signal thus sent is received and prioritized by the control in the unit 28. Assuming as stated above that the fan unit 41 was on a low setting, the first priority for the unit 28 would be an increase in fan speed. This will supply more air as to each of the units 30, 32 because of the combination of more widely opened dampers and the availabilty of increase air flow.

Assuming further that this does not suffice to reduce the temperatures in the areas of the probes 118, 124, additional cooling capacity will be called for and the temperature drop over the evaporator coils 40 in the unit 28 will occur.

Assuming the opposite set of conditions, namely, a decreased call for cooling capacity, the appropriate signals are generated and sent by when a negative going set point is reached and exceedecd. This will, in a normal HVAC unit, call for a throttling of the compressor and subsequently, for a reduction in fan speed to reduce the rate of air flow.

Assuming now a realistic example of operating the climate control system of the invention, it will be assumed that a great many HVAC units are ganged together to service a large number of computer or peripheral units. Typically, this number might be 10 to 50 or more HVAC units and a counterpart number of equipment pieces. According to this system, selected individual HVAC units will be shut down, throttled, run at nominal or even high capacity settings, depending on the condition called for.

In the prior art, the general mechanical space beneath a raised access floor was often cluttered with an indiscriminate array of cables, ducts and other obstructions to air flow. Furthermore, the prior art usually relied on individual ducts, which required complex manifolding even to attempt temperature control according to the present system. Here, the extremely large, open common plenum for a vast number of outlets permits maximum advantage to be taken of staged and/or incremental use of a number of climate control units. The individually adjustable dampers may thus be opened, closed or set to a number of intermediate positions as indicated and temperature contorl is not limited to the spacial zoning only which restricted advantageous control operation in the prior art. The examples heretofore given relate to temperature control, but it will also be understood that this may be applicable to changes of humidity or the like, or enthalpy, representing a heat capacity measurement rather than temperature control per se.

An illustration of peripheral inlets, as well as ordinary duct inlets between the HVAC units and the main plenum area have been illustrated, and it is understood that any combination of these inlet systems may be utilized.

An example of a conduit 51 for passing low voltage wires through a superposed wire is illustrated. It is not normally necessary to provide such a conduit where data cable or other low voltage cables move from their dedicated space 56 to the area above the work floor 26, even though this may be desired in some instances.

It will thus be seen that the present invention provides an improved climated control system and method having a number of novel advantages and characteristics, including those referred to specifically herein and others and which are inherent in the invention. A preferred form of seal unit of the invention having been described in detail, by way of example, it is anticipated tha the variations in the described form of construction may occur to those skilled in the art, and that such variations may be made without departing from the spirit of the invention or the scope of the appended claims.

I claim:

1. A climate control apparatus for disposition within a building room interior, said apparatus comprising, in combination, an access floor assembly disposed within said building room interior, said access floor assembly including an uppermost working area floor lying above and spaced apart from a building floor in said room interior, said access floor assembly further including at least one intermediate floor lying between said working area floor and said building floor so as to define, at least in part, at least one a wireway region between said intermediate floor and said work area floor and an HVAC main plenum space between said building floor and said intermediate floor, at least one plenum inlet extending between a conditioned air source outside said main plenum space and the interior of said main plenum space, and a plurality of plenum outlet stacks extending vertically through said at least one wireway region and between said main plenum space and a plenum outlet area above said working area floor, a control damper unit disposed in each of said plenum outlet stacks, means for adjusting each of said control dampers so as to increase or decrease air flow therethrough, a temperature sensing element disposed adjacent each of said plenum outlet areas and lying above said working area floor, a control unit adapted to communicate with and control the output of an associate HVAC unit, said control unit being operatively connected to each of said temperature sensing units, each of said control dampers, and said HVAC unit, whereby said HVAC unit may controlled so as to provide sufficient conditioned air for said room interior as a whole, and whereby each of said control dampers may permit air flow therethrough as needed to provide a desired air temperature in the vicinity its associated plenum outlet area in said working area floor.

2. A climate control apparatus as defined in claim 1 wherein said at least one plenum inlet is a peripheral inlet lying between said working area floor and said building floor, and between parts of the walls of said building room and the adjacent end portions of said at least one wireway, said wireway end portions being closed off by vertical panels extending beteen said working area floor and said intermediate floor.

3. A climate control apparatus as defined in claim 1 wherein, except for the structure supporting respectively said working area floor, said at least one intermediate floor, and said plenum inlet and said plenum outlet stacks, said main plenum space is substantially unobstructed for uniform, controllable air flow therein said plenum inlets and said plenum outlets.

4. A method of controlling the climate condition within a building room interior, said method comprising the steps of providing an apparatus which includes an access floor assembly disposed within said building room interior, said access floor assembly including an uppermost working area floor lying above and spaced apart from a building floor in said room interior, said access floor assembly further including at least one intermediate floor lying between said working area floor and said building floor so as to define, at least in part, at least one wireway region between said intermediate floor and said work area floor and an HVAC main plenum space between said building floor and said intermediate floor, providing at least one plenum inlet extending between a conditioned air source provided outside said main plenum space and the interior of said main plenum space, and providing a plurality of plenum outlet stacks extending vertically through said at least one wireway region and between said main plenum space and a plenum outlet area above said working area floor, providing a control damper unit within each of said plenum outlet stacks, providing means for adjusting each of said control dampers so as to increase or decrease air flow therethrough, providing a temperature sensing element disposed adjacent each of said plenum outlet areas and lying above said working area floor, providing a control unit adapted to communicate with and control the output of an associated HVAC unit, said control unit being operatively connected to each of said temperature sensing units, each of said control dampers, and said HVAC unit, and thereby controlling said HVAC unit to provide sufficient conditioned air for said room interior as a whole, by permitting air flow through said control dampers as needed to provide a desired climate condition in the vicinity of each plenum outlet area in said working area floor.

5. The method of climate control as defined in claim 4 wherein said at least one plenum inlet is a peripheral inlet lying between said working area floor and said building floor, and between parts of the walls of said building room and the adjacent end portions of said at least one wireway, said wireway end portions being closed off by vertical panels extending between said working area floor and said intermediate floor.

* * * * *